United States Patent
Lee et al.

(10) Patent No.: US 12,201,174 B2
(45) Date of Patent: Jan. 21, 2025

(54) METHOD AND APPARATUS FOR DISPLAYING DARTS ON PATTERN PIECES OF GARMENT

(71) Applicant: CLO Virtual Fashion Inc., Seoul (KR)

(72) Inventors: Ho-Hyun Lee, Seoul (KR); Yeji Kim, Seoul (KR); Michelle Pinkham, New York, NY (US)

(73) Assignee: CLO Virtual Fashion Inc., Seoul (KR)

( * ) Notice: Subject to any disclaimer, the term of this patent is extended or adjusted under 35 U.S.C. 154(b) by 584 days.

(21) Appl. No.: 17/186,467

(22) Filed: Feb. 26, 2021

(65) Prior Publication Data

US 2021/0259341 A1  Aug. 26, 2021

Related U.S. Application Data

(60) Provisional application No. 62/981,962, filed on Feb. 26, 2020.

(30) Foreign Application Priority Data

Sep. 1, 2020 (KR) .......................... 10-2020-0110934

(51) Int. Cl.
   *A41H 3/00* (2006.01)
(52) U.S. Cl.
   CPC .................................. *A41H 3/007* (2013.01)
(58) Field of Classification Search
   None
   See application file for complete search history.

(56) References Cited

U.S. PATENT DOCUMENTS

| | | | | |
|---|---|---|---|---|
| 1,783,004 A | * | 11/1930 | Smith | A41H 3/00 33/14 |
| 2,054,715 A | * | 9/1936 | Stack | A41H 3/00 33/14 |
| 3,803,717 A | * | 4/1974 | Mrak | A41H 3/00 33/12 |
| 4,542,586 A | * | 9/1985 | Hori | A41H 3/00 33/12 |

(Continued)

FOREIGN PATENT DOCUMENTS

| | | |
|---|---|---|
| CN | 105513135 A | 4/2016 |
| CN | 108634459 A | 10/2018 |

(Continued)

OTHER PUBLICATIONS

Optitex Help Center, "2D & 3D Integrated Pattern Design Software O/15," Optitex, Jun. 10, 2017, pp. 1-12.

(Continued)

*Primary Examiner* — Grace Huang
(74) *Attorney, Agent, or Firm* — WTA Patents

(57) ABSTRACT

A method and apparatus for displaying a dart on a pattern piece receives a position of a second dart to be generated in association with a first dart included in at least one pattern piece that forms a garment, sets a pivot point by an intersection point between a first extension line extending from the first dart and a second extension line extending from the second dart, generates the second dart in the pattern piece based on a width of the first dart that is changed by rotating at least a portion of the pattern piece around the pivot point, and displays a pattern piece including the generated second dart.

16 Claims, 9 Drawing Sheets

(56) References Cited

U.S. PATENT DOCUMENTS

| | | | | |
|---|---|---|---|---|
| 4,916,634 | A | * | 4/1990 | Collins .................. A41H 3/007 706/62 |
| 5,107,444 | A | | 4/1992 | Wu |
| 6,751,877 | B2 | * | 6/2004 | Grove ...................... A41H 1/02 33/562 |
| 8,249,738 | B2 | * | 8/2012 | Lastra .................... A41H 3/007 700/132 |
| 2013/0113830 | A1 | * | 5/2013 | Suzuki .................... G06T 19/20 345/634 |
| 2014/0114620 | A1 | * | 4/2014 | Grinspun ............... A41H 3/007 703/1 |

FOREIGN PATENT DOCUMENTS

| | | | | | |
|---|---|---|---|---|---|
| JP | 2002279014 | A | | 9/2002 | |
| JP | 6260050 | B2 | | 1/2018 | |
| JP | 2020-110210 | A | | 7/2020 | |
| KR | 10-0742751 | B1 | | 7/2007 | |
| KR | 101665653 | B1 | | 10/2016 | |
| KR | 10-1672299 | B1 | | 11/2016 | |
| KR | 102173900 | B1 | * | 11/2020 | ............. A41H 3/007 |
| WO | WO2008040167 | A1 | | 4/2008 | |

OTHER PUBLICATIONS

Li Ping et al., Study on the Application of Curved Dart in Costume Design, China Academic Journal Electronic Publishing House, 2019, pp. 16-18, School of Apparel & Art Design, Xi'an Polytechnic University, Xi'an 710048, China (With English Abstract).

Xinzhou Wu et al., Development Of Female Torso Classification And Method Of Patterns Shaping, AUTEX Research Journal, vol. 18, No. 4, Dec. 2018, pp. 419-428 (With English Abstract).

* cited by examiner

METHOD AND APPARATUS FOR DISPLAYING DARTS ON PATTERN PIECES OF GARMENT

CROSS-REFERENCE TO RELATED APPLICATIONS

This application claims the benefit under 35 U.S.C. § 119(e) of U.S. Provisional Application No. 62/981,962 filed on Feb. 26, 2020, and claims the benefit under 35 U.S.C. § 119(a) of Republic of Korea Patent Application No. 10-2020-0110934 filed on Sep. 1, 2020, the entire disclosures of which are incorporated herein by reference for all purposes.

BACKGROUND

1. Field of the Invention

One or more example embodiments relate to a method and apparatus for displaying a dart on a pattern piece of a garment.

2. Description of the Related Art

A garment appears in three dimensions when worn on a person's body, but it is more in two dimensions because it is actually a combination of pieces of fabric cut according to a two-dimensional (2D) pattern. Since fabric which is a material for a garment is flexible, it may be varied in appearance from moment to moment according to a body shape or motion of a person who wears it. For example, a garment worn on a human body may slip down or become wrinkled and folded by gravity, wind, or collisions with the body. A dart is a portion that is formed by gathering a certain portion (e.g., waist, shoulder, and side) into a triangular fold and shrinking the portion or by gathering such a portion into a triangular fold with a seam not exposed outside, and is used to fit 2D fabric into a three-dimensional (3D) body shape. The dart is used to make a certain portion of a garment look more voluminous or create an ornamental effect in the garment. However, it may not be simple to display a plurality of darts on a pattern piece to create a desired 3D contour in the pattern piece.

The above description has been possessed or acquired by the inventor(s) in the course of conceiving the present invention and is not necessarily an art publicly known before the present application is filed.

SUMMARY

An aspect provides a method and apparatus to display a plurality of darts in association with each other on a pattern piece of a garment.

Another aspect provides a method and apparatus to automatically simulate a pattern of a garment including a dart.

According to an example embodiment, there is provided a method of displaying a dart on a pattern piece, the method including receiving a position of a second dart to be generated in association with a first dart included in at least one pattern piece that forms a garment, setting a pivot point by an intersection point between a first extension line extending from the first dart and a second extension line extending from the second dart, generating the second dart in the pattern piece based on a width of the first dart that is changed by rotating at least a portion of the pattern piece around the pivot point, and displaying a pattern piece including the generated second dart.

The generating of the second dart may include generating a plurality of duplicate pattern pieces that divide at least a portion of the pattern piece based on the pivot point, changing a width of the first dart by rotating one of the duplicate pattern pieces around the pivot point, determining a width of the second dart based on the changed width of the first dart, and generating, in the pattern piece, the second dart to which the determined width of the second dart is applied.

The width of the second dart may be determined in association with the changed width of the first dart.

The generating of the duplicate pattern pieces may include dividing the pattern piece into a first portion and a second portion by a region defined by a remaining portion obtained by removing a portion extending beyond the pivot point from the first extension line and by the second extension line; and generating the duplicate pattern pieces corresponding to the first portion and the second portion.

The method may further include at least one of determining a duplicate pattern piece to be rotated among the duplicate pattern pieces, or determining a rotation direction of the determined duplicate pattern piece.

The changing of the width of the first dart may include rotating the determined duplicate pattern piece around the pivot point in the determined rotation direction, and changing the width of the first dart in proportion to an angle between both line segments of the first dart that is changed by the rotating.

The determining of the width of the second dart may include calculating a difference between the width of the first dart before being changed and the changed width of the first dart, and determining the width of the second dart based on a ratio of the difference.

The method may further include determining a depth of the second dart corresponding to the position of the second dart. The generating of the second dart may include generating the second dart in the pattern piece while maintaining the depth of the second dart.

The receiving of the position of the second dart may include one of receiving a start point of the second dart on an outer line of the pattern piece on which the first dart is displayed, receiving a vertex of the second dart in the pattern piece on which the first dart is displayed, and receiving a vertex of the second dart in a pattern piece associated with the pattern piece on which the first dart is displayed.

The setting of the pivot point may include generating the first extension line of a center line of the first dart that passes through a vertex of the first dart, generating the second extension line extending in a normal direction from the start point or the vertex of the second dart, and setting, as the pivot point, the intersection point between the first extension line and the second extension line.

The method may further include re-receiving a depth of the second dart corresponding to the position of the second dart.

According to another example embodiment, there is provided an apparatus for displaying a dart on a pattern piece, the apparatus including a user interface (UI) configured to receive a position of a second dart to be generated in association with a first dart included in at least one pattern piece that forms a garment, a processor configured to set a pivot point by an intersection point between a first extension line extending from the first dart and a second extension line extending from the second dart, and generate the second dart in the pattern piece based on a width of the first dart that is changed by rotating at least a portion of the pattern piece around the set pivot point, and an output device configured to display a pattern piece including the second dart.

The processor may generate a plurality of duplicate pattern pieces that divide at least a portion of the pattern piece based on the pivot point, change a width of the first dart by rotating one of the duplicate pattern pieces around the pivot point, determine a width of the second dart based on the changed width of the first dart, and generate, in the pattern piece, the second dart to which the determined width of the second dart is applied.

The width of the second dart may be determined in association with the changed width of the first dart.

The processor may divide the pattern piece into a first portion and a second portion by a region defined by a remaining portion obtained by removing a portion extending beyond the pivot point from the first extension line and by the second extension line, and generate the duplicate pattern pieces corresponding to the first portion and the second portion.

The processor may determine a duplicate pattern piece to be rotated among the duplicate pattern pieces, and determine a rotation direction of the determined duplicate pattern piece.

The processor may rotate the determined duplicate pattern piece around the pivot point in the determined rotation direction, and change the width of the first dart in proportion to an angle between both line segments of the first dart that is changed by the rotating.

The processor may calculate a difference between the width of the first dart before being changed and the changed width of the first dart, and determine the width of the second dart based on a ratio of the difference.

The processor may determine a depth of the second dart corresponding to the position of the second dart, and generate the second dart in the pattern piece while maintaining the determined depth of the second dart.

Additional aspects of embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
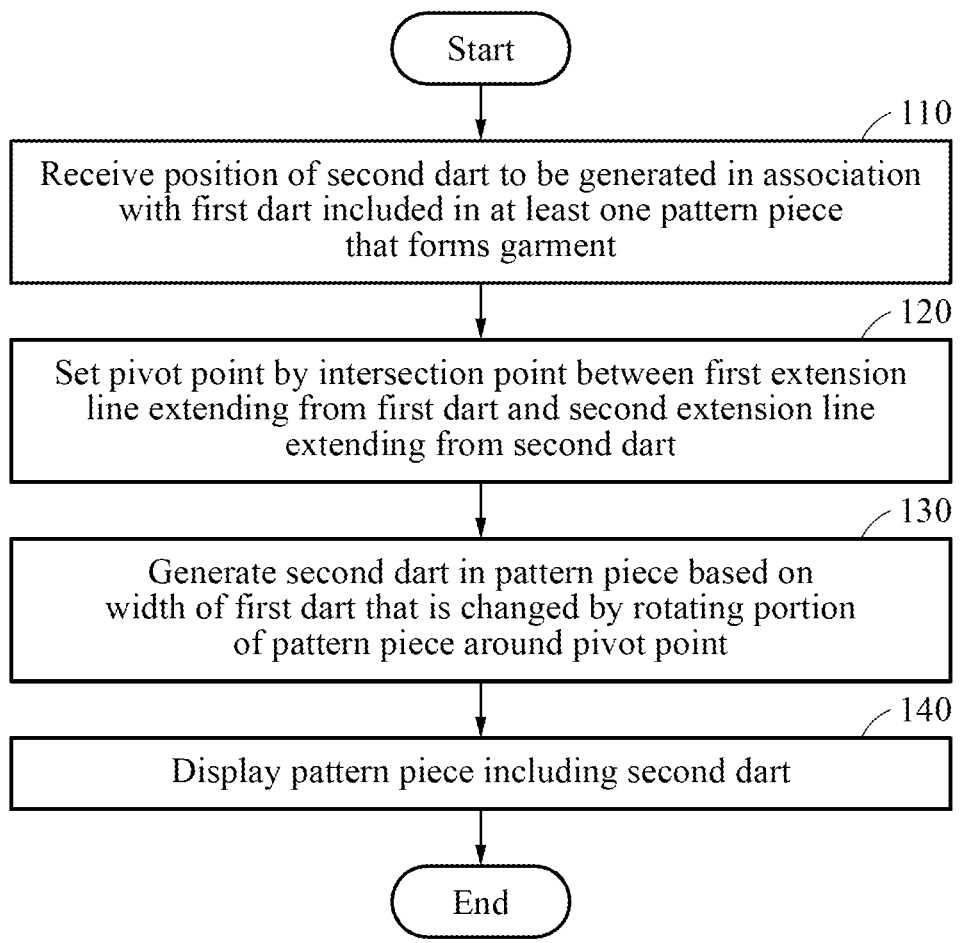
FIG. 1 is a flowchart illustrating an example of a method of displaying a dart on a pattern piece according to an example embodiment.

Hereinafter, embodiments are described in detail with reference to the accompanying drawings. With respect to the descriptions of the drawings, like reference numerals refer to like elements. Various modifications are possible in various embodiments described below. Embodiments described below are not intended to be limited to the implementation forms, and it is understood that it should include all modifications, equivalents, and/or alternatives according to various embodiments.

The terminology used herein is for the purpose of describing particular examples only and is not intended to limit the example embodiments. As used herein, the singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

In addition, terms such as first, second, A, B, (a), (b), and the like may be used herein to describe components. Each of these terminologies is not used to define an essence, order or sequence of a corresponding component but used merely to distinguish the corresponding component from other component(s). It should be noted that if it is described in the specification that one component is "connected", "coupled", or "joined" to another component, a third component may be "connected", "coupled", and "joined" between the first and second components, although the first component may be directly connected, coupled or joined to the second component.

Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the inventive concept.

Furthermore, in describing example embodiments with reference to the accompanying drawings, the same reference denotations are assigned to the same elements without regard to the drawing denotations, a duplicated description thereof will be omitted. When it is determined that a detailed description of the related well-known technology unnecessarily blurs the gist of embodiments in describing embodiments, a detailed description thereof will be omitted.

The same name may be used to describe an element included in the examples described herein and an element having a common function. Unless otherwise mentioned, the descriptions of the examples may be applicable to the following examples, and thus duplicated and redundant descriptions will be omitted for conciseness.

FIG. 1 is a flowchart illustrating an example of a method of displaying a dart on a pattern piece according to an example embodiment. A pattern piece described herein may refer to a piece of a two-dimensional (2D) pattern for a three-dimensional (3D) garment. Although a 2D pattern piece will be simply referred to hereinafter as a pattern piece for the convenience of description, a pattern piece may be construed as a 2D pattern piece despite the absence of such a description. A pattern piece may correspond to a portion of a 2D pattern that is used for producing a garment a user desires to drape over or on a 3D avatar. A pattern piece may correspond to each body portion of a 3D avatar and include, for example, a cuff, a back piece, a front piece, a collar, pants or a skirt, and the like.

A garment described herein may be 3D virtual clothes corresponding to a 2D pattern. The 2D pattern may be a pattern on a 2D plane that is virtually produced by a computer program. The 2D pattern may include a pattern piece(s) corresponding to body parts of a 3D avatar, for example, wrist, torso (front and back), neck, and legs. The 2D pattern may be modeled with a mesh including a plurality of polygons, for example, triangles, to simulate the 3D virtual clothes. For example, three vertices of a triangle may be point masses having mass, and sides of the triangle may be represented as springs having elasticity that connects the point masses. Thus, the 2D pattern may be modeled by a mass-spring model, for example. The springs may have respective resistance values against, for example, stretch, shear, and bending, depending on a material property of fabric used. Each vertex may move according to the action of an external force such as gravity, and the action of an internal force such as stretch, shear, and bending. For example, when a force being applied to each vertex is obtained by calculating the external force and the internal force, a displacement of each vertex and a speed of a motion of each vertex may be obtained. In addition, a motion of the virtual clothes may be simulated through a motion of vertices of a polygon in each time step. According to an example embodiment, by draping, over a 3D avatar, 2D virtual garment patterns formed in mesh, it is possible to embody 3D virtual clothes that look natural based on the laws of physics. The term "drape" or "draping" described herein may be construed as a process of putting, on a 3D avatar, 3D clothes formed by combining or sewing 2D pattern pieces by a computer program.

Referring to FIG. 1, an apparatus for displaying a dart on a pattern piece (hereinafter simply a "displaying apparatus") may display a second dart associated with a first dart on a pattern piece by performing operations 110 through 140 to be described hereinafter.

In operation 110, the displaying apparatus receives a position of a second dart to be generated in association with a first dart included in at least one pattern piece that forms a garment.

Here, "to generate a second dart in association with a first dart" may be construed as "to generate a second dart that provides a desired 3D contour in combination with a first dart." For example, in a case in which the first dart is used to create a 3D contour in a portion, for example, a chest or a waist, of a garment, using the two darts including the second dart in addition to the first dart may be more effective to express such a 3D contour, rather than producing the 3D contour only with the first dart.

Thus, according to an example embodiment, it is possible to express a 3D contour of a garment more fully by generating a second dart having a proportional relationship with a first dart in terms of width and/or depth. Here, generating the second dart to have a proportional relationship with a width and/or a depth of the first dart may correspond to generating the second dart in association with the first dart. The first dart may also be referred to as an original dart in that it is a dart originally included in a pattern piece.

Figure 3:
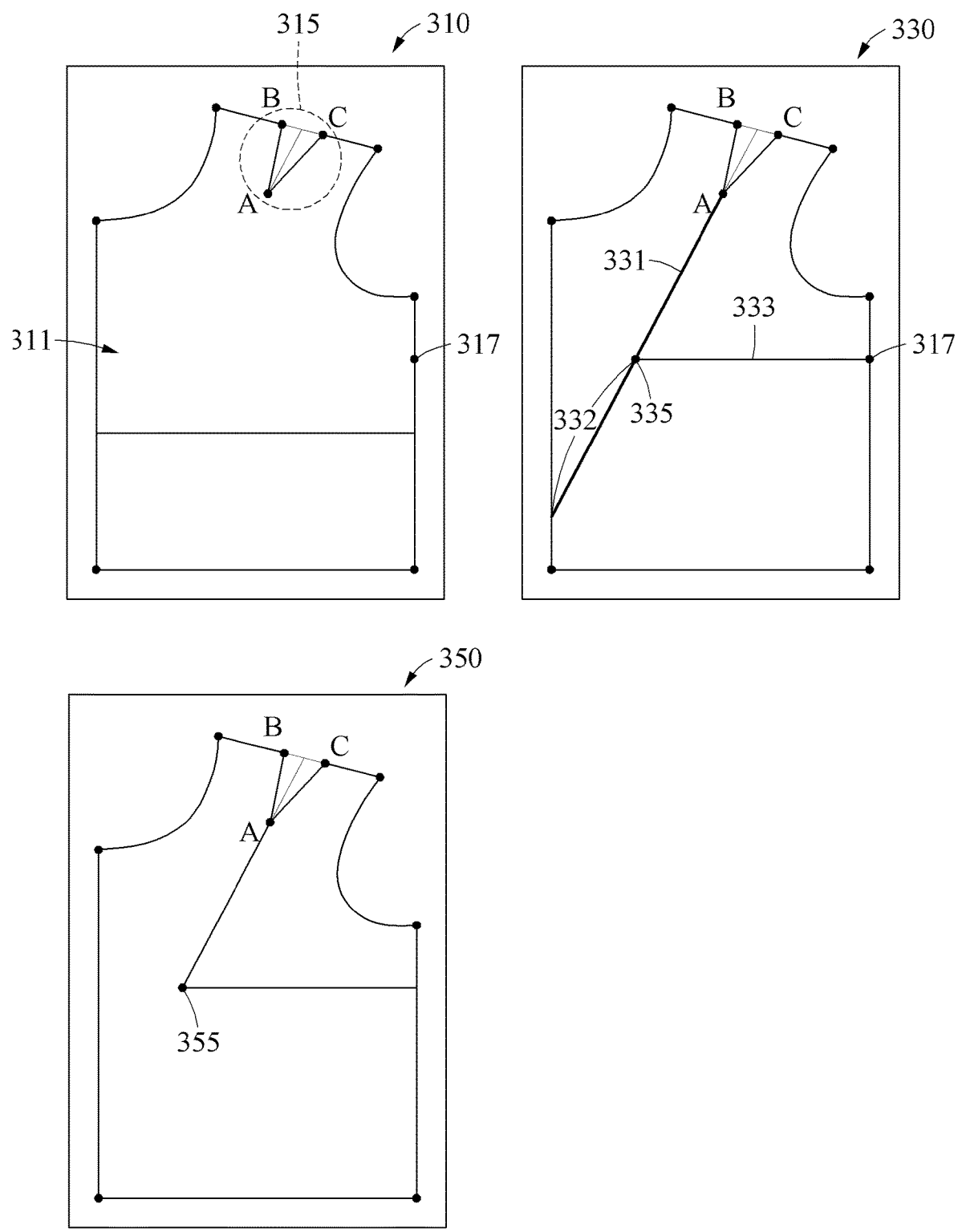
FIGS. 3 and 4 are diagrams illustrating examples of setting a pivot point according to an example embodiment.

Each portion of a dart may be defined as follows. A width of a dart may correspond to a length of a line that connects vertices B and C among three vertices A, B, and C that form a first dart 315, as illustrated in FIG. 3, for example. A depth of a dart may correspond to a length of a line that connects a center point between the vertices B and C to the vertex A, as illustrated in FIG. 3, for example. In such an example, an extension of the line that connects the center point between the vertices B and C to the vertex A may also be referred to as a center line of the dart.

The vertex A may also be referred to as an apex. A first line that connects the vertex A (or the apex A) and the vertex B and a second line that connects the vertex A (or the apex A) and the vertex C may correspond to both line segments. An angle between both the line segments may correspond to an internal angle formed by the first line and the second line at the vertex A (or the apex A).

For example, in operation 110, the displaying apparatus may receive a start point 317 of a second dart to be newly generated on an outer line of a pattern piece 311 on which a first dart 315 is displayed as shown in a screen 310 of FIG. 3. In this example, the start point 317 of the second dart may correspond to a center point of the second dart. Alternatively, in operation 110, the displaying apparatus may receive a vertex (or an apex) 417 of a second dart in a pattern piece 411 on which a first dart 413 is displayed as shown in a screen 410 of FIG. 4. Alternatively, the displaying apparatus may receive a vertex (or an apex) of a second dart in a pattern piece associated with a pattern piece on which a first dart is displayed. Here, the pattern piece associated with the pattern piece on which the first dart is displayed may be construed as a pattern piece that is mutually connected with the pattern piece on which the first dart is displayed.

The displaying apparatus may receive the position of the second dart through a user interface (UI) (e.g., a UI 910 of FIG. 9), such as, for example, a mouse and a stylus pen.

In operation 120, the displaying apparatus sets a pivot point by an intersection point between a first extension line extending from the first dart and a second extension line extending from the second dart. The second extension line extending from the second dart may correspond to a line segment that passes through a center point of a dart to be moved as at least a portion of a pattern piece is rotated. The pivot point, or a center point of a rotation, may be construed as a point of a central axis for a rotation of at least a portion of a pattern piece for generating the second dart. The operation 120 of setting the pivot point will be described in detail with reference to FIGS. 2 through 4.

In operation 130, the displaying apparatus generates the second dart in the pattern piece based on a width of the first dart that is changed by rotating at least a portion of the pattern piece around the pivot point set in operation 120. Here, a correlation between the width of the first dart that is changed by the rotation of the portion of the pattern piece and a width of the second dart to be generated in association with the first dart may be determined by a plurality of duplicate pattern pieces. The operation 130 of generating the second dart will be described in detail with reference to FIGS. 5 through 7.

In operation 140, the displaying apparatus displays a pattern piece including the second dart generated in operation 130. The displaying apparatus may display the pattern piece including the second dart explicitly or implicitly. The explicit display of the pattern piece including the second dart may include, for example, displaying the pattern piece including the second dart on a drawing on a display panel and/or fabric or paper. The implicit display of the pattern piece including the second dart may include, for example, simulating a 3D virtual garment corresponding to the pattern piece including the second dart and/or simulating, on a drawing, a 3D avatar draped in a virtual garment corresponding to the pattern piece including the second dart.

Figure 2:
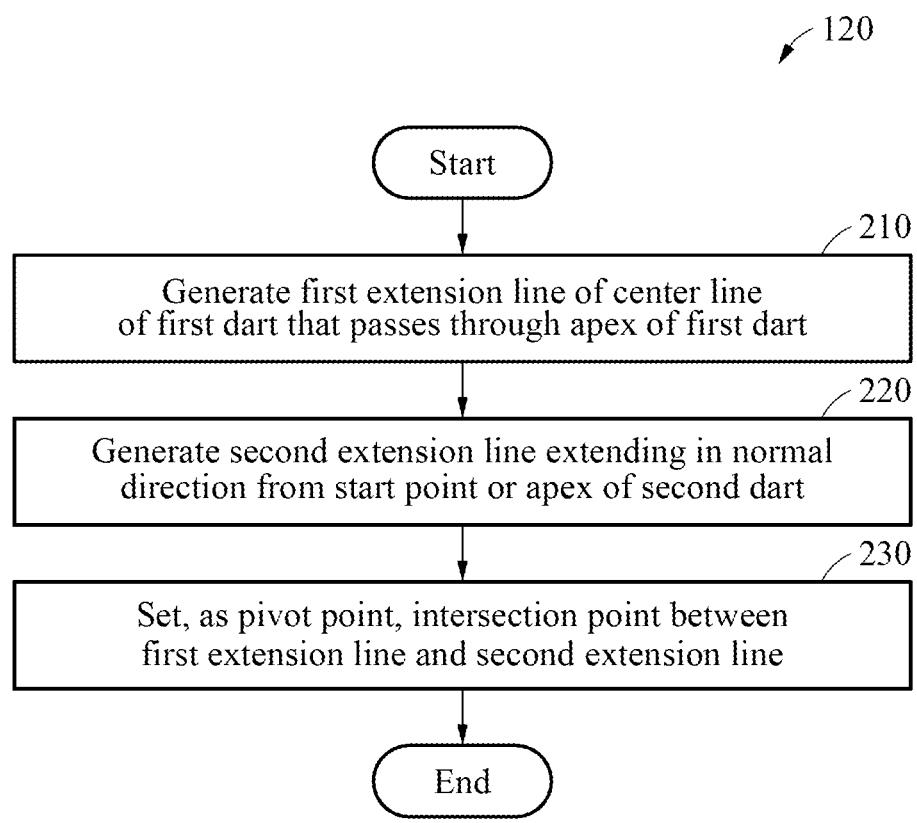
FIG. 2 is a flowchart illustrating an example of a method of setting a pivot point according to an example embodiment.

FIG. 2 is a flowchart illustrating an example of a method of setting a pivot point according to an example embodiment. Referring to FIG. 2, the displaying apparatus may set a pivot point by performing operations 210 through 230 to be described hereinafter.

In operation 210, the displaying apparatus generates a first extension line of a center line of a first dart that passes through a vertex (or an apex) of the first dart.

In operation 220, the displaying apparatus generates a second extension line extending in a normal direction from a start point or a vertex (or an apex) of a second dart.

In operation 230, the dart displaying apparatus sets, as a pivot point, an intersection point between the first extension line generated in operation 210 and the second extension line generated in operation 220.

FIG. 3 is a diagram illustrating an example of setting a pivot point according to an example embodiment. Referring to FIG. 3, on a screen 310, there is a start point 317 of a second dart that is received on an outer line of a pattern piece 311 on which a first dart 315 is displayed. On a screen 330, there are a first extension line 331 extending from a vertex (or an apex) of the first dart 315 and a second extension line 333 extending in a normal direction from the start point 317 of the second dart. On a screen 350, there is a pivot point 355 that is set by an intersection point between the first extension line 331 and the second extension line 333.

As shown in the screen 310, the displaying apparatus may receive the start point 317 of the second dart on the outer line of the pattern piece 311 on which the first dart 315 is displayed.

For example, a user may move a point of a mouse cursor or a stylus pen to the outer line of the pattern piece 311 displayed on the screen 310. In this example, in response to the mouse cursor or the stylus pen moving onto the outer line of the pattern piece 311, a guiding phrase, for example, "click on a guideline to rotate the center point," may be displayed on the screen 310. When, as per the guiding phrase, the user clicks the start point 317 at which the second dart is to be generated on the outer line of the pattern piece 311, the displaying apparatus may receive a position of the second dart as an input. In this example, the start point 317 of the second dart may correspond to a center point of the second dart corresponding to a center between two vertices on an outer line of the second dart.

As shown in the screen 330, the displaying apparatus may generate the first extension line 331 by extending a center line of the first dart 315 that passes through a vertex (e.g., an apex A) of the first dart 315. In addition, the displaying apparatus may generate the second extension line 333 extending in the normal direction vertical to the outer line from the start point 317 of the second dart. Here, a point at which the first extension line 331 and the second extension line 333 meet each other may be an intersection point 335. The displaying apparatus may display the first extension line 331 and the second extension line 333 in different colors on the screen 330.

As shown in the screen 350, the displaying apparatus may set, as the pivot point 355, the intersection point 335 at which the first extension line 331 and the second extension line 333 meet each other. The displaying apparatus may remove a portion 332 that extends beyond the pivot point 355 from the first extension line 331 as shown in the screen 350. The displaying apparatus may then divide the pattern piece into a first portion and a second portion by a region defined by a remaining portion obtained by removing the portion extending beyond the pivot point 355 and by the second extension line 333.

Figure 4:
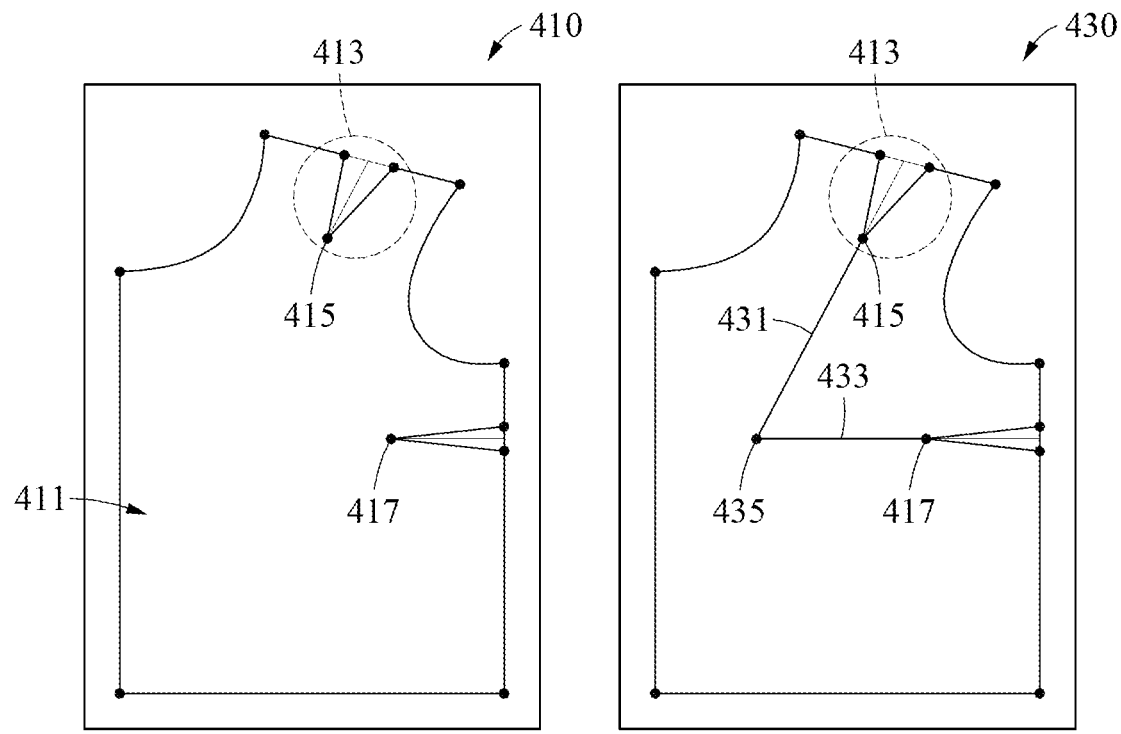

FIG. 4 is a diagram illustrating another example of setting a pivot point according to an example embodiment. Referring to FIG. 4, on a screen 410, there is a vertex (or an apex) 417 of a second dart that is received in a pattern piece 411 on which a first dart 413 is displayed. On a screen 430, there is a pivot point that is set by an intersection point 435 between a first extension line 431 of a center line of the first dart 413 and a second extension line 433 extending from the apex 417 of the second dart.

As shown in the screen 410, the displaying apparatus may receive the apex 417 of the second dart in the pattern piece 411 on which the first dart 413 is displayed. For example, when a user moves a point of a mouse cursor or a stylus pen to select one point in the pattern piece 411 displayed on the screen 410, the displaying apparatus may determine the point selected by the user to be the apex 417 of the second dart.

As shown in the screen 430, the displaying apparatus may automatically set, as the pivot point, the intersection point 435 at which the first extension line 431 of the center line of the first dart 413 that passes through an apex 415 of the first dart 413 and the second extension line 433 extending in a normal direction from the apex 417 of the second dart intersect with each other.

Figure 5:
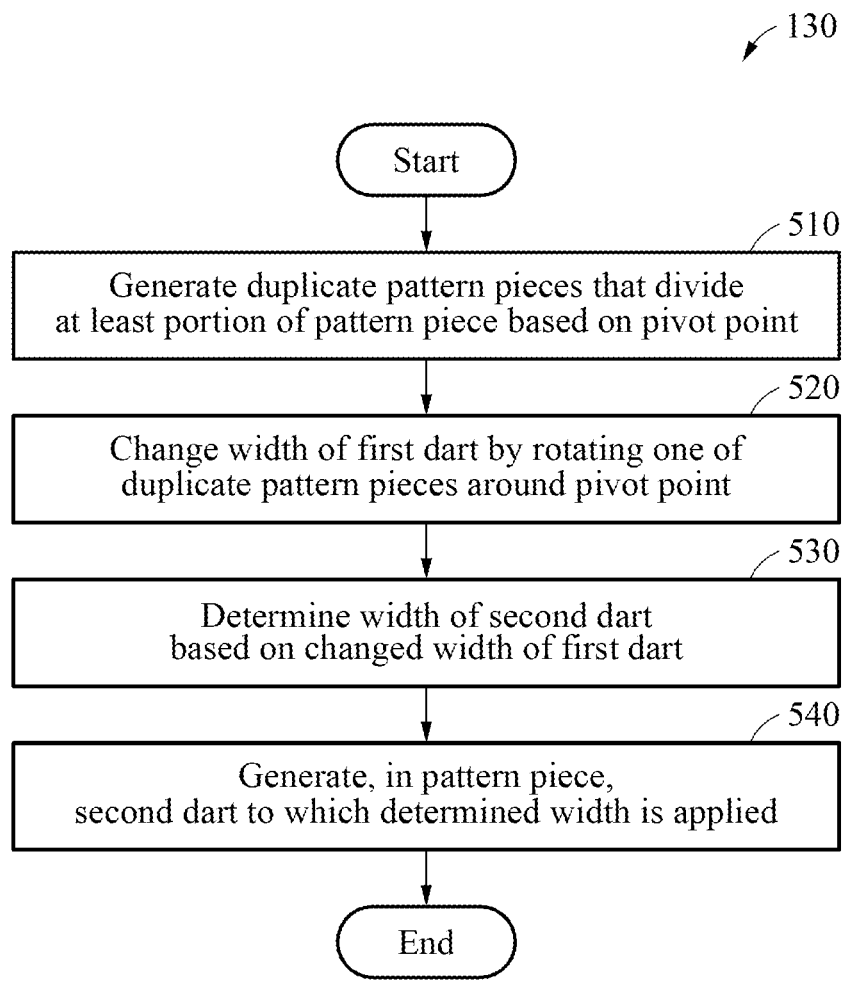
FIG. 5 is a flowchart illustrating an example of a method of generating a second dart according to an example embodiment.

FIG. 5 is a flowchart illustrating an example of a method of generating a second dart according to an example embodiment. Referring to FIG. 5, the displaying apparatus may generate a second dart in a pattern piece by performing operations 510 through 540 to be described hereinafter.

In operation 510, the displaying apparatus generates a plurality of duplicate pattern pieces that divide at least a portion of a pattern piece based on a pivot point. For example, the displaying apparatus may divide the pattern piece into a first portion and a second portion by a remaining portion obtained by removing a portion that exceeds an intersection point from each of a first extension line and a second extension line. The displaying apparatus may generate the duplicate pattern pieces respectively corresponding to the first portion and the second portion.

In operation 520, the displaying apparatus changes a width of a first dart by rotating one of the duplicate pattern pieces around the pivot point.

The displaying apparatus may determine a duplicate pattern piece to be rotated among the duplicate pattern pieces. For example, the displaying apparatus may determine one of the duplicate pattern pieces that is to be rotated as a user selects one from the duplicate pattern pieces. For example, when the user puts a point of a mouse cursor at a position corresponding to one of the duplicate pattern pieces, the displaying apparatus may determine a duplicate pattern piece corresponding to the position to be the duplicate pattern piece to be rotated.

Depending on examples, the displaying apparatus may determine a duplicate pattern piece having a minimum size to be the duplicate pattern piece to be rotated, or determine a duplicate pattern piece having a maximum size to be the duplicate pattern piece to be rotated.

In addition, the displaying apparatus may determine a rotation direction of the duplicate pattern piece to be rotated. For example, the displaying apparatus may receive what is input from the user with respect to the rotation direction, or automatically determine the rotation direction by a direction that decreases the width of the first dart or a direction that increases the width of the second dart.

In operation 520, the displaying apparatus rotates the determined duplicate pattern piece in the determined rotation direction around the pivot point. For example, the displaying apparatus may change the width of the first dart in proportion to an angle between both line segments of the first dart that is changed by the rotation. In this example, the duplicate pattern pieces may be matched to corresponding portions of the pattern piece. Thus, the width of the first dart may be changed as a distance by which the duplicate pattern piece moves by the rotation is applied to a width of a matched corresponding portion (e.g., the first dart) of the pattern piece.

In operation 530, the displaying apparatus determines a width of the second dart based on the width of the first dart that is changed in operation 520. For example, the width of the second dart may be determined in association with the width of the first dart that is changed in operation 520.

For example, the displaying apparatus may calculate a difference between a first width which is the width of the first dart before the change and a second width which is the changed width of the first dart, in operation 530. In this example, the displaying apparatus may determine the width of the second dart based on a ratio (e.g., 50% or 70%) of the difference between the first width and the second width.

Depending on examples, the displaying apparatus may detect a position where a user clicks a duplicate pattern piece with a mouse, and may calculate a rotation angle between the position and a position of a pivot point by an intersection between a first extension line extending from the first dart and a second extension line extending from the second dart.

The displaying apparatus may determine the width or the length of the second dart based on the calculated rotation angle. Depending on examples, when one of duplicate pattern pieces is rotated around a pivot point, the displaying apparatus may detect a position of a mouse changed based on the rotated duplicate pattern piece, and may determine the width or the length of the second dart based on a rotation angle obtained by the changed position of the mouse.

In operation 540, the displaying apparatus generates, in the pattern piece, the second dart to which the width of the second dart determined in operation 530 is applied.

Depending on examples, the displaying apparatus may determine a depth of the second dart corresponding to the position of the second dart. In this example, a depth value of the second dart may be initially set by a depth value of the first dart. Afterward, the displaying apparatus may determine, to be the depth of the second dart, a depth value input from the user through a UI screen (e.g., a UI screen 830 of FIG. 8). In such an example, the displaying apparatus may generate the second dart in the pattern piece while maintaining the depth of the second dart.

Depending on examples, the displaying apparatus may receive again a depth of the second dart corresponding to a position of the second dart.

Figure 6:
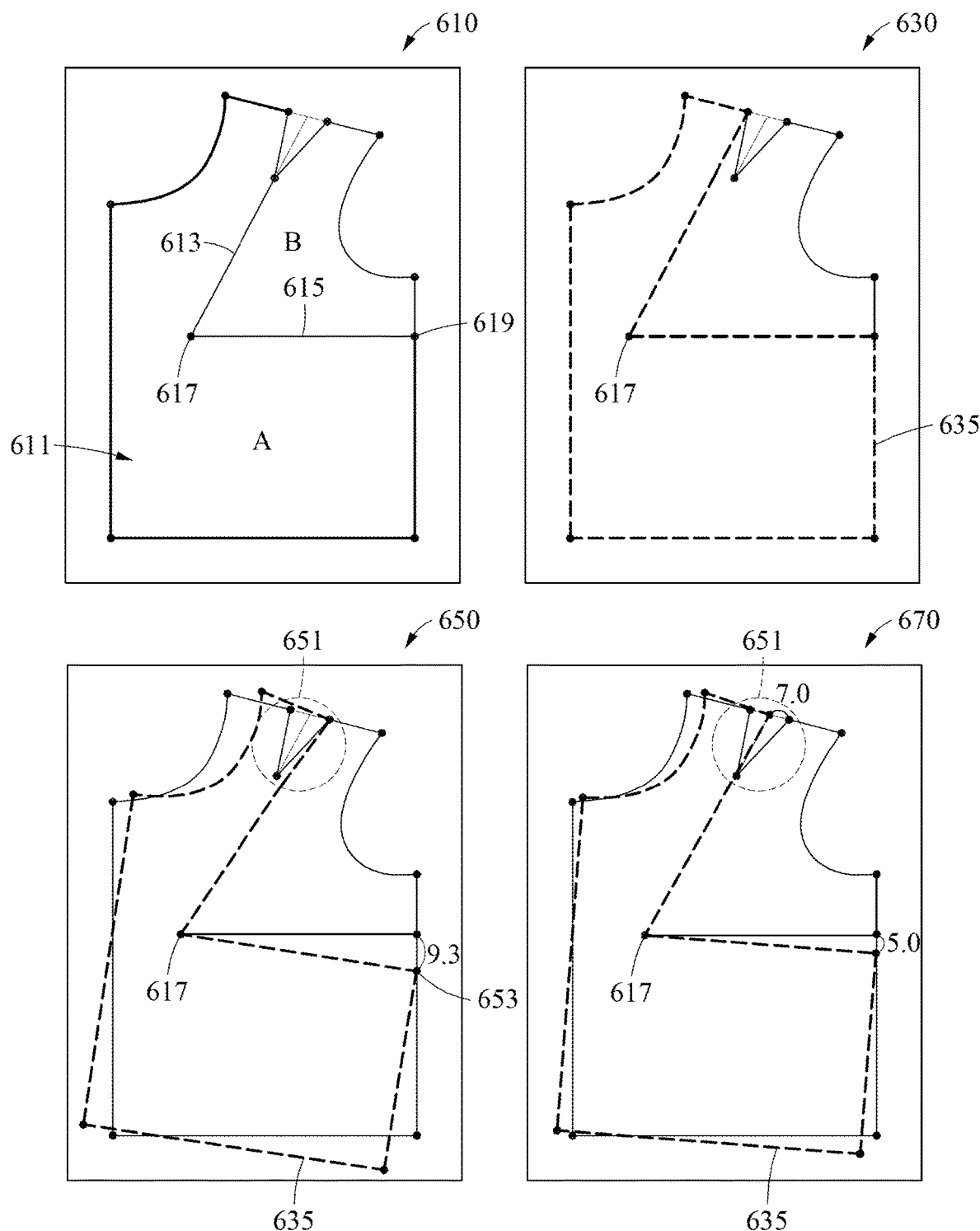
FIGS. 6 and 7 are diagrams illustrating examples of generating a second dart according to an example embodiment.

FIG. 6 is a diagram illustrating an example of generating a second dart according to an example embodiment. Referring to FIG. 6, on a screen 610, there is a pattern piece 611 that is divided into a portion A and a portion B based on a pivot point 617. On a screen 630, there is a duplicate pattern piece 635 corresponding to the portion A of the pattern piece 611. On a screen 650, there is a result obtained by rotating the duplicate pattern piece 635 around the pivot point 617 by a width of a first dart 651. On a screen 670, there is a result obtained by rotating the duplicate pattern piece 635 around the pivot point 617 by ½ of the width of the first dart 651.

As shown in the screen 610, the displaying apparatus may divide the pattern piece 611 into two portions by a partial first extension line 613 corresponding to a remaining portion obtained by removing a portion extending beyond the pivot point 617 and by a second extension line 615 extending from a center point 619 of a second dart. That is, the displaying apparatus may divide the pattern piece 611 into the portion A and the portion B as illustrated. For example, when a user puts a mouse cursor in the portion A on the screen 610, mouseover may occur on an outer line of a pattern piece corresponding to the portion A in which the mouse cursor is positioned. In this example, the outer line of the pattern piece corresponding to the portion A may include vertices of the pattern piece.

As shown in the screen 630, the displaying apparatus may generate the duplicate pattern piece 635 corresponding to the portion A by connecting the vertices included in the outer line of the pattern piece corresponding to the portion A and the pivot point 617. Although not illustrated in FIG. 6, the displaying apparatus may also generate a duplicate pattern piece corresponding to the portion B by connecting vertices included in an outer line of a pattern piece corresponding to the portion B and the pivot point 617.

The displaying apparatus may determine a duplicate pattern piece to be rotated as the user selects one from among a plurality of duplicate pattern pieces on the screen 630. For example, the displaying apparatus may determine, to be the duplicate pattern piece to be rotated, a duplicate pattern piece corresponding to a point at which the user puts a point of a mouse among the duplicate pattern pieces. An outer line of the duplicate pattern piece that is determined to be the duplicate pattern piece to be rotated may be displayed differently from a duplicate pattern piece that is not to be rotated. The outer line of the determined duplicate pattern piece may be referred to as "ghost".

For example, as shown in the screen 650, the displaying apparatus may rotate the duplicate pattern piece 635 around the pivot point 617 by a width (e.g., 14 millimeters (mm)) of the first dart 651. For example, the displaying apparatus may receive what the user selects with respect to a rotation direction, or automatically determine the rotation direction that decreases the width of the first dart 651.

As shown in the screen 650, the displaying apparatus may rotate the duplicate pattern piece 635 around the pivot point 617 rightward by the width (e.g., 14 mm) of the first dart 651. As the displaying apparatus rotates the duplicate pattern piece 635 by the width of the first dart 651, the width of the first dart 651 may be changed to 0 mm. In addition, by the rotation of the duplicate pattern piece 635, a position of a vertex 653 of the duplicate pattern piece 635 corresponding to the center point 619 of the second dart in the pattern piece 611 may move downward by 9.3 mm. For example, the displaying apparatus may determine, to be the width of the second dart, a distance (or a result value obtained by multiplying the distance by a preset ratio) of the vertex 653 that is moved in association with the decrease in the width of the first dart 651 from 14 mm to 0 mm by the rotation of the duplicate pattern piece 635.

Alternatively, as shown in the screen 670, the displaying apparatus may rotate the duplicate pattern piece 635 around the pivot point 617 rightward by ½ (e.g., 7 mm) of the width of the first dart 651. As the displaying apparatus rotates the duplicate pattern piece 635 by ½ (e.g., 7 mm) of the width of the first dart 651, the width of the first dart 651 may be changed to 7 mm. By the rotation of the duplicate pattern piece 635, a position of the vertex 653 of the duplicate pattern piece 635 corresponding to the center point 619 of the second dart in the pattern piece 611 may move downward by a value (e.g., approximately 5 mm) corresponding to a ratio (e.g., 70%) of a width difference (e.g., 7 mm) between the width of the first dart 651 before the change and the width of the first dart 651 after the change.

For example, the displaying apparatus may determine, to be the width of the second dart, the distance (e.g., 5 mm) of the vertex 653 that is moved in association with the decrease in the width of the first dart 651 from 14 mm to 7 mm by the rotation of the duplicate pattern piece 635 on the screen 670.

The displaying apparatus may alter the first dart 651 based on the changed width (e.g., 7 mm) and display an altered first dart obtained by the altering, and generate the second dart by applying the determined width (e.g., 5 mm) of the second dart. Here, a depth of the second dart may be automatically determined correspondingly to a position of the second dart, or determined by a value input from the user through a UI (e.g., a UI 830 of FIG. 8). The displaying apparatus may generate the second dart in the pattern piece while maintaining the depth of the second dart that is determined correspondingly to the position of the second dart.

The displaying apparatus may display a pattern piece including the altered first dart and the generated second dart.

According to an example embodiment, a dart (e.g., a first dart) of which a width decreases by a rotation of the duplicate pattern piece 635 may be referred to as a closed dart. In addition, a dart (e.g., a second dart) of which a width increases by a rotation of the duplicate pattern piece 635 may be referred to as an open dart.

Figure 8:
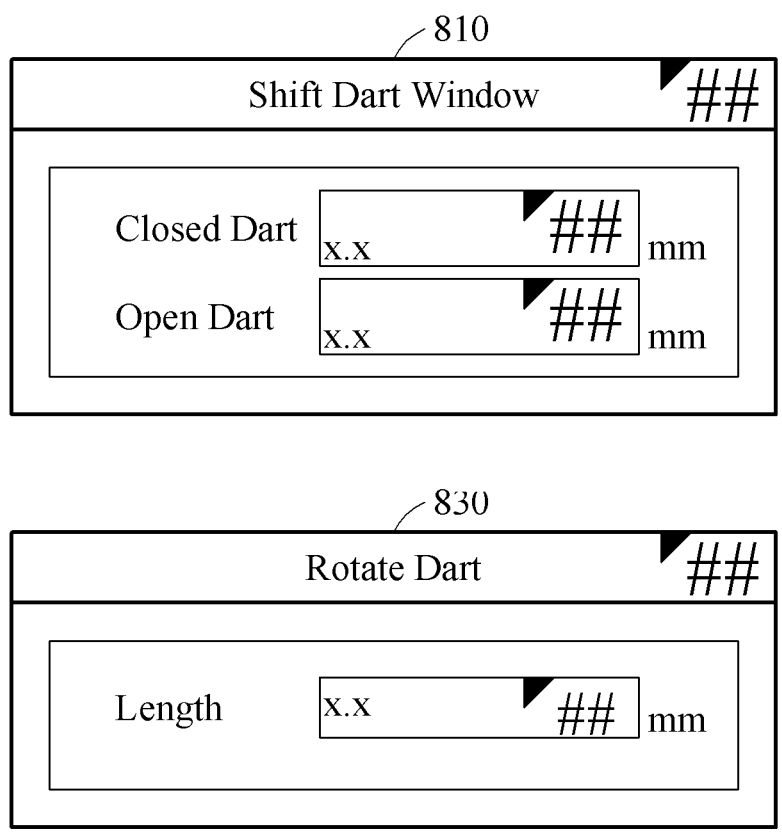
FIG. 8 is a diagram illustrating an example of a user interface (UI) screen for setting a width and a depth of a second dart according to an example embodiment.

Depending on examples, the displaying apparatus may receive a width of the first dart (or the closed dart) and a width of the second dart (or the open dart) directly from the user through a UI (e.g., a UI 810 of FIG. 8). When the widths of the first dart and the second dart are input directly from the user, the displaying apparatus may move the duplicate pattern piece 635 such that width values input by the user are satisfied. Here, a width of the second dart may not exceed a maximum width of the first dart.

Figure 7:
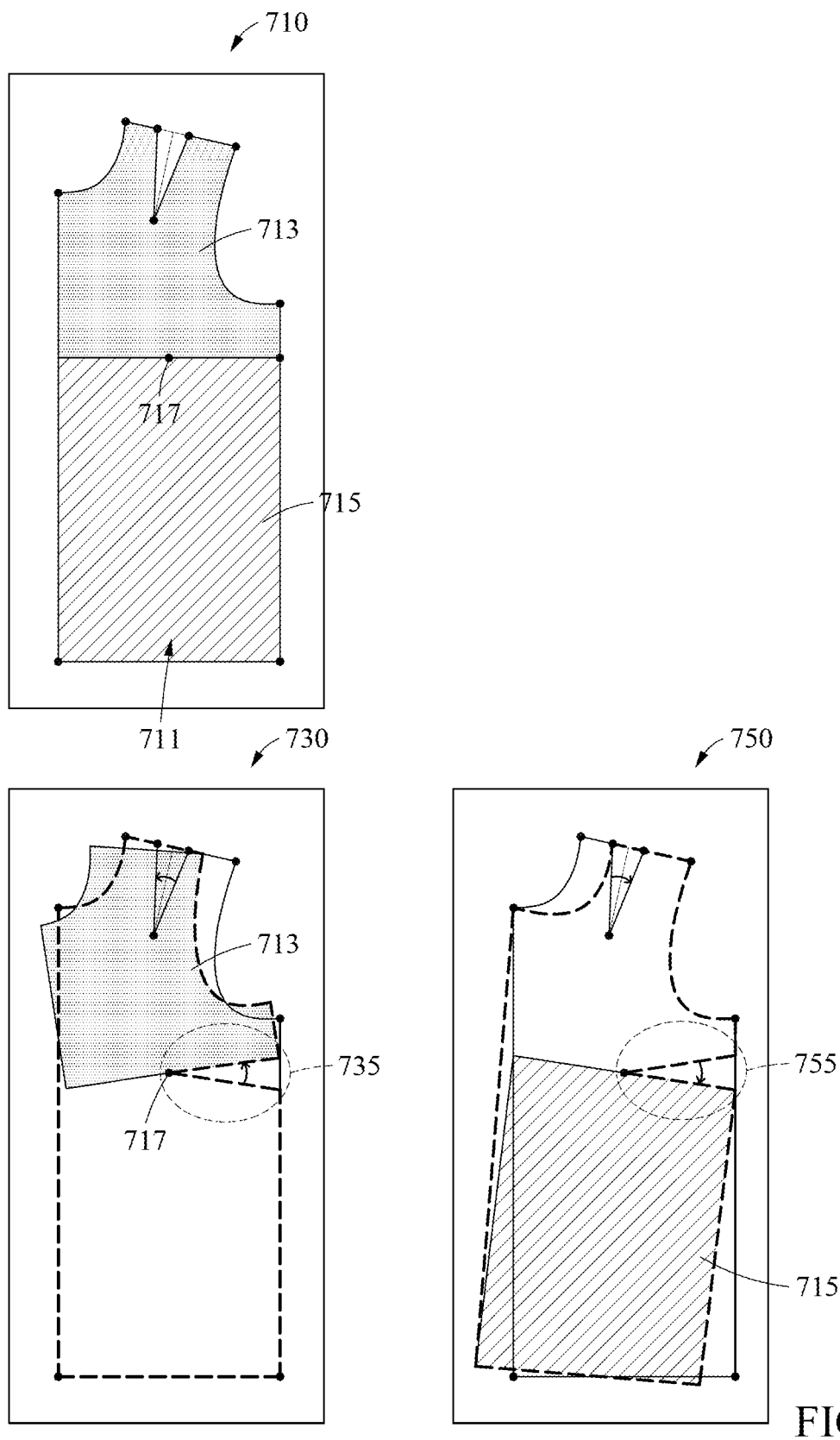

FIG. 7 is a diagram illustrating another example of generating a second dart according to an example embodiment. Referring to FIG. 7, two duplicate pattern pieces including a first duplicate pattern piece 713 and a second duplicate pattern piece 715 may be generated in a pattern piece 711 as shown in a screen 710. A second dart 735 may be generated by rotating the first duplicate pattern piece 713 as shown in a screen 730 and a second dart 755 may be generated by rotating the second duplicate pattern piece 715 as shown in a screen 750.

As shown in the screen 710, the displaying apparatus may generate a plurality of duplicate pattern pieces, for example, the first duplicate pattern piece 713 and the second duplicate pattern piece 715, that divide at least a portion of the pattern piece 711 based on a pivot point 717 set in the pattern piece 711. For example, as illustrated in FIG. 6, the duplicate pattern pieces may be divided by a region defined by a remaining portion obtained by removing a portion extending beyond a pivot point from a first extension line and by a second extension line. Alternatively, the duplicate pattern pieces may be divided by a horizontal line that includes the pivot point 717 as shown in the screen 710.

A duplicate pattern piece generated in an upper portion of the pattern piece 711 from the pivot point 717 on the screen 710 may be referred to herein as the first duplicate pattern piece 713. A duplicate pattern piece generated in a lower portion of the pattern piece 711 from the pivot point 717 on the screen 710 may be referred to herein as the second duplicate pattern piece 715. Each vertex of the first duplicate pattern piece 713 and the second duplicate pattern piece 715 may be matched to each vertex of the pattern piece 711.

For example, when rotating the first duplicate pattern piece 713 as shown in the screen 730, the displaying apparatus may rotate the first duplicate pattern piece 713 leftward around the pivot point 717 to increase a width of the second dart 735. In this example, the displaying apparatus may determine, to be the width of the second dart 735, a width that is proportional to a distance by which a vertex on an outer line of the first duplicate pattern piece 713 is moved by a rotation of the first duplicate pattern piece 713, and generate the second dart 735 based on the determined width of the second dart 735.

For another example, when rotating the second duplicate pattern piece 715 as shown in the screen 750, the displaying apparatus may rotate the second duplicate pattern piece 715 rightward around the pivot point 717 to increase a width of the second dart 755. In this example, the displaying apparatus may determine, to be the width of the second dart 755, a width that is proportional to a distance by which a vertex on an outer line of the second duplicate pattern piece 715 is moved by a rotation of the second duplicate pattern piece 715, and generate the second dart 755 based on the determined width of the second dart 755.

FIG. 8 is a diagram illustrating an example of a UI screen for setting a width and a depth of a second dart according to an example embodiment. Referring to FIG. 8, there are an example of a UI screen 810 through which the displaying apparatus receives a width of a first dart and a width of a second dart from a user, and an example of a UI screen 830 through which the displaying apparatus receives a depth of the second dart from the user.

For example, when the user clicks right with a mouse while rotating a duplicate pattern piece by putting a mouse cursor at the duplicate pattern piece as shown in the screen 650 or 670 of FIG. 6, a Shift Dart window may be displayed as shown in the screen 810. On the Shift Dart window, a UI may be displayed to receive a width of the first dart which is a closed dart and a width of the second dart which is an open dart.

A width of each dart displayed on the Shift Dart window may be a width of the first dart that is moved at a point in time at which the user clicks right with the mouse while moving the duplicate pattern piece, and a width of the second dart. Here, a minimum value of a width of each dart may be 0.0 mm, and a maximum value of a width of each dart may correspond to a width of the first dart.

The user may input a new width of the first dart and a width of the second dart through the Shift Dart window displayed as shown in the screen 810, and the displaying apparatus may display the first dart and the second dart to which the input widths are applied.

For another example, when, after the second dart is generated as shown in the screen 730 or the screen 750 of FIG. 7, the user moves a mouse cursor to a start point or an end point of the second dart displayed on the screen 730 or the screen 750, a dart length may be adjusted based on a position of the mouse cursor and the length of the second dart may be displayed on a dart center line corresponding to the position of the mouse cursor. For example, when the user clicks right with a mouse while moving the mouse cursor with respect to the second dart, a Rotate Dart window may be displayed as shown in the screen 830. On the Rotate Dart window, a UI may be displayed to receive a length of the second dart. An initial length value of the second dart displayed on the Rotate Dart window may correspond to a length (or depth) of the second dart at a point in time at which the user clicks right with the mouse at a position of the second dart. Here, a minimum length (or depth) of the second dart may be 0.0 mm, and a maximum length (or depth) of the second dart may be a length from an outer line of a corresponding pattern piece to a pivot point.

The user may input a new length of the second dart through the Rotate Dart window, and the displaying apparatus may display the second dart to which the input length is applied.

Figure 9:
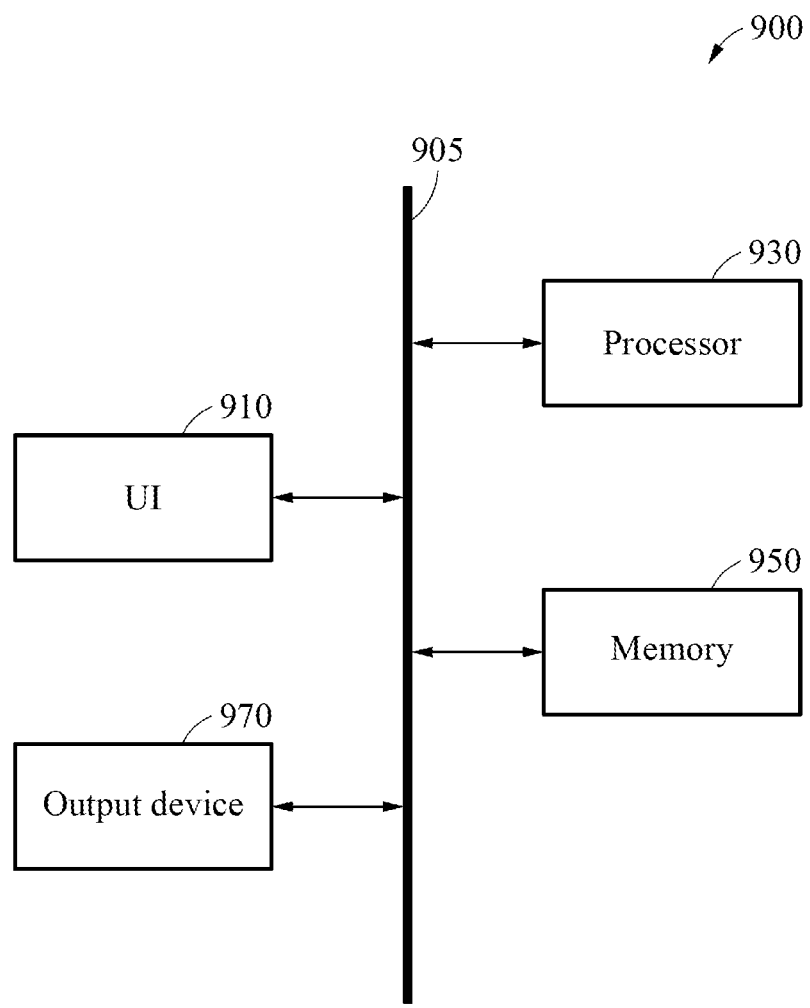
FIG. 9 is a diagram illustrating an example of an apparatus for displaying a dart on a pattern piece according to an example embodiment.

FIG. 9 is a diagram illustrating an example of a displaying apparatus according to an example embodiment. Referring to FIG. 9, a displaying apparatus 900 includes a UI 910, a processor 930, a memory 950, and an output device 970. The UI 910, the processor 930, the memory 950, and the output device 970 may communicate with one another through a communication bus 905.

The UI 910 may receive a position of a second dart to be generated in association with a first dart included in at least one pattern piece that forms a garment.

The processor 930 may set a pivot point by an intersection point between a first extension line extending from the first dart and a second extension line extending from the second dart received from a user through the UI 910. The processor 930 may generate the second dart in the pattern piece based on a width of the first dart that is changed by rotating at least a portion of the pattern piece around the pivot point.

The memory 950 may store information associated with the position of the second dart that is received through the UI 910. The memory 950 may store information associated with the pivot point set by the processor 930 and/or the width of the first dart that is changed by rotating at least a portion of the pattern piece around the pivot point. In addition, the memory 950 may store information associated with a pattern piece in which the second dart is generated.

The memory 950 may store various sets of information generated in a processing process performed by the processor 930. The memory 950 may also store other various sets of data and programs. The memory 950 may include a volatile or nonvolatile memory. The memory 950 may include a massive storage medium, such as, for example, a hard disk, to store various sets of data.

The output device 970 may display the pattern piece including the second dart generated by the processor 930. The output device 970 may output, onto a drawing, the pattern piece including the second dart, a virtual garment simulated in response to the pattern piece including the second dart, and/or a 3D avatar draped in the virtual garment. Alternatively, the output device 970 may output, onto a sheet of paper or fabric, the pattern piece including the second dart.

The output device 970 may be, for example, a display device, or a printing device that prints the pattern piece onto a sheet of paper or fabric.

In addition, the processor 930 may perform an algorithm corresponding to one or more, or all, of the operations or methods described above with reference to FIGS. 1 through 8. The processor 930 may be a data processing device embodied by hardware having a circuit of a physical structure to perform desired operations. The desired operations may include, for example, a code or instructions included in a program. The processor 930 may be embodied as a central processing unit (CPU), a graphics processing unit (GPU), or a neural processing unit (NPU), for example. The displaying apparatus 900 embodied by hardware may include, for example, a microprocessor, a CPU, a processor core, a multi-core processor, a multiprocessor, an application-specific integrated circuit (ASIC), and a field-programmable gate array (FPGA).

The processor 930 may execute the program and control the displaying apparatus 900. A code of the program executed by the processor 930 may be stored in the memory 950.

According to an example embodiment described herein, it is possible to display a plurality of darts in association with each other on a pattern piece of a garment.

According to an example embodiment described herein, it is possible to automatically simulate a pattern of a garment including a dart.

The units described herein may be implemented using hardware components and software components. For example, the hardware components may include microphones, amplifiers, band-pass filters, audio to digital convertors, non-transitory computer memory and processing devices. A processing device may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums. The non-transitory computer readable recording medium may include any data storage device that can store data which can be thereafter read by a computer system or processing device.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A method of displaying a pattern piece, comprising:
   receiving a position of a second dart that provides a desired 3D contour in combination with a first dart included in the pattern piece that forms a garment through a user interface (UI);
   setting an intersection point between a first extension line extending from the first dart and a second extension line extending from a center point of the second dart as a pivot point;
   generating the second dart in the pattern piece based on a width of the first dart that is changed by rotating at least a portion of the pattern piece around the pivot point; and
   displaying the pattern piece including the generated second dart through a display device,
   wherein the generating of the second dart comprises:
      generating a plurality of duplicate pattern pieces that divide at least a portion of the pattern piece based on the pivot point;
      changing a width of the first dart by rotating one of the duplicate pattern pieces around the pivot point;
      determining a width of the second dart based on the changed width of the first dart; and
      generating, in the pattern piece, the second dart to which the determined width of the second dart is applied, and
   wherein the changing of the width of the first dart comprises:
      when one of the duplicate pattern pieces is rotated around the pivot point, detecting a position of a mouse changed based on the rotated duplicate pattern piece, and
      determining the width or a length of the second dart based on a rotation angle obtained by the changed position of the mouse.

2. The method of claim 1, wherein the generating of the duplicate pattern pieces comprises:
   dividing the pattern piece into a first portion and a second portion defined by a first extension line in which a portion extending beyond the pivot point of the first extension line is removed and by the second extension line; and
   generating the duplicate pattern pieces corresponding to the first portion and the second portion.

3. The method of claim 1, further comprising at least one of:
   determining a duplicate pattern piece to be rotated among the duplicate pattern pieces; and
   determining a rotation direction of the determined duplicate pattern piece.

4. The method of claim 3, wherein the changing of the width of the first dart comprises:
   rotating the determined duplicate pattern piece around the pivot point in the determined rotation direction; and
   wherein the width of the first dart is changed in proportion to an angle between both line segments of the first dart that is being changed by the rotating.

5. The method of claim 3, wherein the determining of the width of the second dart comprises:
   calculating a difference between the width of the first dart before being changed and the changed width of the first dart; and
   determining the width of the second dart based on a ratio of the difference.

6. The method of claim 1, further comprising:
   determining a depth of the second dart corresponding to the position of the second dart,
      wherein the generating of the second dart comprises:
      generating the second dart in the pattern piece while maintaining the depth of the second dart.

7. The method of claim 1, wherein the receiving of the position of the second dart comprises:
   receiving a start point of the second dart on an outer line of the pattern piece on which the first dart is displayed.

8. The method of claim 7, wherein the setting as the pivot point comprises:
   generating the first extension line of a center line of the first dart that passes through a vertex of the first dart; and
   generating the second extension line extending in a normal direction from the start point of the second dart.

9. The method of claim 1, further comprising:
   receiving a depth of the second dart corresponding to the position of the second dart.

10. A non-transitory computer-readable storage medium storing instructions that, when executed by a processor, cause the processor to perform the method of claim 1.

11. An apparatus for displaying a pattern piece, comprising:
   a user interface (UI) configured to receive a position of a second dart that provides a desired 3D contour in combination with a first dart included in the pattern piece that forms a garment;
   a processor configured to set an intersection point between a first extension line extending from the first dart and a second extension line extending from a center point of the second dart as a pivot point, and generate the second dart in the pattern piece based on a width of the first dart that is changed by rotating at least a portion of the pattern piece around the set pivot point; and an output device configured to display the pattern piece including the second dart, wherein the processor is configured to:
generate a plurality of duplicate pattern pieces that divide at least a portion of the pattern piece based on the pivot point;
change a width of the first dart by rotating one of the duplicate pattern pieces around the pivot point;
determine a width of the second dart based on the changed width of the first dart; and
generate the second dart in the pattern piece to which the determined width of the second dart is applied, and wherein the processor is configured to change the width of the first dart by:
when one of the duplicate pattern pieces is rotated around the pivot point, detecting a position of a mouse changed based on the rotated duplicate pattern piece, and
determining the width or a length of the second dart based on a rotation angle obtained by the changed position of the mouse.

12. The apparatus of claim 11, wherein the processor is configured to:
divide the pattern piece into a first portion and a second portion defined by the first extension line, in which a portion extending beyond the pivot point of the first extension line is removed, and by the second extension line; and
generate the duplicate pattern pieces corresponding to the first portion and the second portion.

13. The apparatus of claim 11, wherein the processor is configured to:
determine a duplicate pattern piece to be rotated among the duplicate pattern pieces; and
determine a rotation direction of the determined duplicate pattern piece.

14. The apparatus of claim 13, wherein the processor is configured to:
rotate the determined duplicate pattern piece around the pivot point in the determined rotation direction; and
change the width of the first dart in proportion to an angle between both line segments of the first dart that is changed by the rotating.

15. The apparatus of claim 13, wherein the processor is configured to:
calculate a difference between the width of the first dart before being changed and the changed width of the first dart; and
determine the width of the second dart based on a ratio of the difference.

16. The apparatus of claim 11, wherein the processor is configured to:
determine a depth of the second dart corresponding to the position of the second dart; and
generate the second dart in the pattern piece while maintaining the determined depth of the second dart.

* * * * *